(12) United States Patent
Takeuchi et al.

(10) Patent No.: US 7,144,146 B2
(45) Date of Patent: Dec. 5, 2006

(54) TRANSPARENT SUBSTRATE FOR AREA LIGHT EMITTING DEVICE, A METHOD FOR PRODUCING TRANSPARENT SUBSTRATE, AND AREA LIGHT EMITTING DEVICE AND LIQUID CRYSTAL DISPLAY DEVICE

(75) Inventors: Norihito Takeuchi, Kariya (JP); Fumikazu Isogai, Kariya (JP); Haruyuki Ishikawa, Kariya (JP); Mikio Yoshida, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

(21) Appl. No.: 10/808,649

(22) Filed: Mar. 25, 2004

(65) Prior Publication Data

US 2005/0151226 A1    Jul. 14, 2005

(30) Foreign Application Priority Data

Mar. 26, 2003  (JP) .............................. 2003-085740

(51) Int. Cl.
*F21V 5/02* (2006.01)
(52) U.S. Cl. .................. 362/617; 362/561; 362/619; 359/599
(58) Field of Classification Search ................ 362/617, 362/619, 606, 26, 355, 561; 349/112, 63; 359/599, 615
See application file for complete search history.

(56) References Cited

U.S. PATENT DOCUMENTS

| 4,648,691 A * | 3/1987 | Oguchi et al. .............. 349/162 |
|---|---|---|
| 5,833,517 A | 11/1998 | Konda et al. ................. 451/29 |
| 6,225,741 B1 | 5/2001 | Nakamura et al. .......... 313/506 |
| 6,295,104 B1 * | 9/2001 | Egawa et al. ................. 349/63 |
| 6,542,207 B1 | 4/2003 | Yoshizawa .................... 349/69 |
| 6,547,408 B1 | 4/2003 | Greiner ....................... 362/31 |
| 6,719,930 B1 * | 4/2004 | Chen et al. ................... 264/2.5 |
| 6,767,105 B1 * | 7/2004 | Nakahashi et al. ........... 362/27 |
| 2001/0053075 A1* | 12/2001 | Parker et al. ................ 362/31 |

FOREIGN PATENT DOCUMENTS

| EP | 0 590 511 A1 | 4/1994 |
| EP | 1 067 329 A1 | 1/2001 |
| JP | 05045652 A * | 2/1993 |
| JP | 05139098 A * | 6/1993 |
| JP | 8-083688 | 3/1996 |

* cited by examiner

*Primary Examiner*—Renee Luebke
*Assistant Examiner*—Robert May
(74) *Attorney, Agent, or Firm*—Morgan & Finnegan, LLP (57) ABSTRACT

A transparent substrate used for an area light emitting device. The transparent substrate comprises a light incidence surface and a light exit surface opposite to the light incidence surface. A plurality of recesses are formed on the light exit surface bulged towards the light incidence surface. Each recess has a shape approximately corresponding to a portion of an oval sphere. Each recess perimeter on the light exit surface is approximately circle. Each recess is separately formed from other recesses.

11 Claims, 13 Drawing Sheets

TRANSPARENT SUBSTRATE FOR AREA LIGHT EMITTING DEVICE, A METHOD FOR PRODUCING TRANSPARENT SUBSTRATE, AND AREA LIGHT EMITTING DEVICE AND LIQUID CRYSTAL DISPLAY DEVICE

BACKGROUND OF THE INVENTION

The present invention relates to a transparent substrate used for an area light emitting device, method for making the same, and an area light emitting device including the same, and liquid crystal display device with the area light emitting device. The transparent substrate has a light incidence surface and a light exit surface opposite to the light incidence surface and includes a means for emitting the incident light towards the outside.

A bottom emission type area light emitting device is conventionally known. The light source includes a transparent substrate with a light incidence surface and a light exit surface opposite to the light incidence surface, and a light emitting element such as organic electroluminescence device formed on the light incidence surface of the substrate. Light emitted from the organic electroluminescence device is introduced into the transparent substrate and the incident light is emitted from the light exit surface to the outside.

This type of area light emitting device cannot emit the entire amount of light, which is generated by the light emitting element and is emitted to the transparent substrate, to the outside. This is because the light, other than those incident light rays on the light exit surface with an incident angle smaller than the critical angle, is reflected on the light exit surface due to the difference in both indices. The critical angle on the light exit surface is defined by refractive indices of the transparent substrate and the outer atmosphere (air in general) The light reflected on the light exit surface can be emitted outside of the device through the edge of the transparent substrate, can be attenuated after repeated reflection within the substrate, or can be attenuated by propagation into the area light emitting device, so that it would not be emitted from the light exit surface to the outside.

In order to take out the light that is difficult to emit from the light exit surface, a technique has been proposed to form a light scattering portion on the light exit surface of the transparent substrate (Japanese Laid-Open Patent Publication 8-83688). According to the publication, the light, which cannot be taken out from the light exit surface, is scattered at the light scattering portion to enable a portion of the light to emit from a planar light exit surface of a transparent substrate.

Further, an area light emitting device is required in general to have high luminance in a specific direction on the light exit surface.

For example, in an area light emitting device assembled in a liquid crystal display device, it is necessary that the amount of light emitted in the direction perpendicular to the light exit surface be larger than the amount of light emitted in other directions.

Accordingly, it is necessary that the transparent substrate emits light, which entered from the area light emitting device, at a high rate from the light exit surface (improved light extraction efficiency) and that the luminance in a specific direction at the light exit surface is high (improved light usage).

BRIEF SUMMARY OF THE INVENTION

The present invention has been made in view of the above described requirements. It is an object of the invention to provide a transparent substrate for an area light emitting device, which not only has high light extraction efficiency when used in an area light emitting device, but which also has high light usage efficiency when used in an area light emitting device and a liquid crystal display device.

Another object of the invention is to provide a method for producing such a transparent substrate for an area light emitting device.

A further object of the invention is to provide an area light emitting device which has high light extraction efficiency and high light usage efficiency.

A still further object of the invention is to provide a liquid crystal display device having the above described planar light source.

In order to achieve the above objects, the transparent substrate for area light emitting device according to the invention includes a transparent substrate used for an area light emitting device comprising a light incidence surface and a light exit surface opposite to the light incidence surface. A plurality of recesses are formed on the light exit surface bulging towards the light incidence surface. The surfaces of each recess form a shape approximately corresponding to a portion of an oval sphere. The perimeter of each recess on the light exit surface is approximately oval. Each recess is separately formed from the other recesses.

Note that the term "oval sphere" denotes a shape obtained by rotating a planar oval around its major or minor axis. Accordingly, the recess can be described to have approximately the same shape as a part of the oval sphere, whose major axis or minor axis is approximately perpendicular to the light exit surface.

Further in the above transparent substrate, the depth of each recess is preferably half or less of the transparent substrate thickness, is at most 1.5 folds of the diameter of the perimeter on the light exit surface and is at least 0.1 μm.

Further, each recess is preferably formed separately from any other recess.

In the case where each recess is separately formed from other recesses, the recesses are positioned so that the shortest distance from the nearest adjacent recess is at least 50 μm and that distance between the centers of the perimeter on the light exit surface is at most 200 μm.

The recesses can be disposed in a manner the sum of the diameter of the recess perimeter on the light exit surface and the shortest distance to a nearest adjacent recess is at least the length of the minor axis of the oval sphere and at most the length of the major axis or the oval sphere.

The recesses can be arranged on the light exit surface in a manner to approximate a hexagonal close-packed structure or a cubic close-packed structure with respect to the center of the recess perimeter on the light exit surface.

The area light emitting device of the invention includes the transparent substrate and a light emitting element disposed opposite to the light emitting surface. The area light emitting device further includes a light reflecting member which reflects light emitted from the transparent substrate back towards the transparent substrate in a direction opposite to the light emitting element, or, within the area light emitting device, to extract light outside after transmitting the light through the transparent substrate.

The light emitting element can be either an organic electroluminescence device or an inorganic electroluminescence device.

Note that a prism sheet can be disposed opposite to the light emitting element on the transparent substrate.

A liquid crystal display device according to the invention includes the area light emitting device described above and a liquid crystal display panel. The liquid crystal display panel is disposed in the path of the light emitted by the area light emitting device.

In the liquid crystal display device, the liquid crystal display panel is positioned relative to the area light emitting device so that lines formed between centers of adjacent pixels on the display surface and lines formed between centers of the areas defined by adjacent recess perimeters on the light exit surface are displaced from each other (not parallel to each other), when viewed from the display surface of the liquid crystal display panel.

A method for producing the transparent substrate for an area light emitting device according to the invention includes a step of forming the recess by sandblasting on the light exit surface side of the transparent substrate.

Another method for producing the transparent substrate for an area light emitting device according to the invention includes a step of forming the recess by providing a mask on the light exit surface side of the transparent substrate, in the areas where recesses are not formed, and performing sandblasting.

BRIEF DESCRIPTION OF THE DRAWINGS

The invention, together with objects and advantages thereof, may best be understood by reference to the following description of the presently preferred embodiments together with the accompanying drawings in which:

FIGS. 5(a) and 5(c) are top views and FIGS. 5(b) and 5(d) are cross sectional views;

FIGS. 6(a)–6(d) show that the transparent substrate of the invention has higher light extraction efficiency than a transparent substrate having the recesses formed in a cylindrical shape, where FIGS. 6(a) and 6(c) are top views and FIGS. 6(b) and 6(d) are cross sectional views;

DETAILED DESCRIPTION OF THE PREFERRED EMBODIMENTS

An organic electroluminescence illumination device, an example of an area light emitting device according to one embodiment of the invention, and a liquid crystal display device having the organic electroluminescence device are described in detail below. The transparent substrate according to one embodiment of the invention and the method for producing the substrate are also described below. Note that elements specified by similar reference numerals show the same or similar elements in the figures.

An area light emitting device 1 according to one embodiment of the invention is described.

((Area Light Emitting Device 1))

Figure 1:
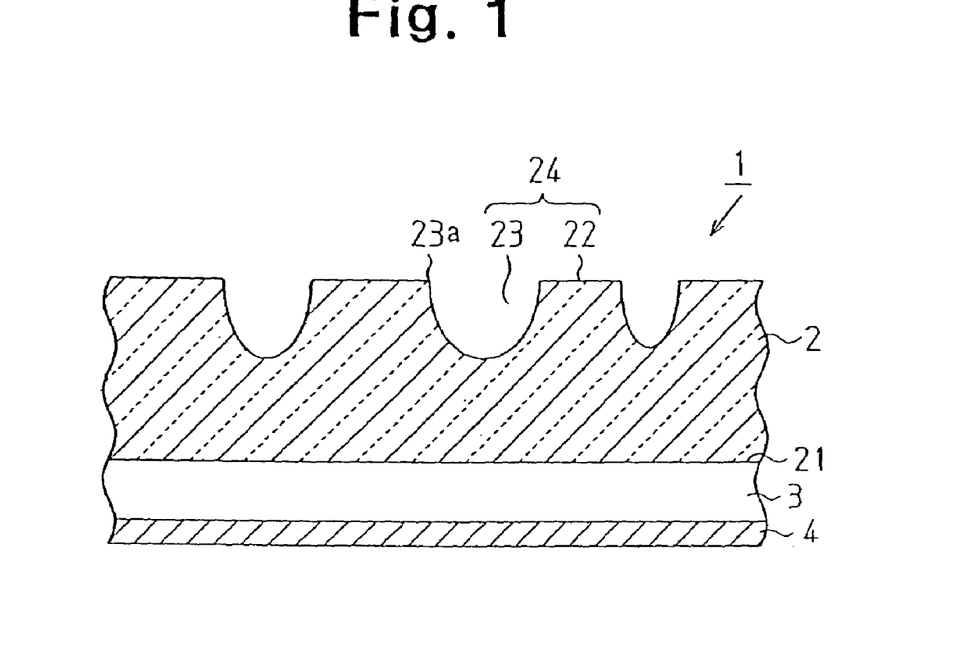
FIG. 1 is a cross sectional view which shows the structure of an organic electroluminescence device according to one embodiment of the invention.
Figure 2:
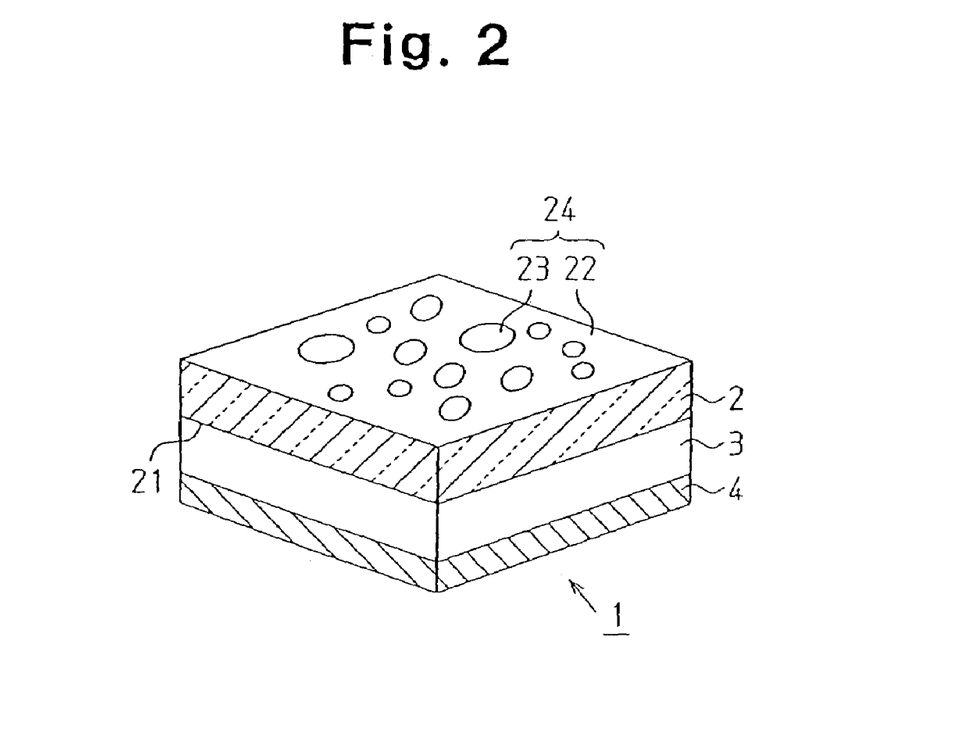
FIG. 2 is a perspective view which shows the structure of an organic electroluminescence device according to one embodiment of the invention.

As shown in FIGS. 1 and 2, the area light emitting device 1 includes an organic electroluminescence device 3, a light emitting element, on the light incidence surface 21 of the transparent substrate 2. A light reflecting member 4 is formed on the organic electroluminescence device 3.

A known optical member such as prism film can also be disposed on or above the light exit surface 22 of the transparent substrate 2.

The transparent substrate 2 is described in detail.

(Transparent Substrate 2)

As shown in FIGS. 1 and 2, the transparent substrate 2 has a light incidence surface 21 and a light exit surface 22 opposite the light incidence surface 21, and is a substrate for supporting the organic electroluminescence device 3. The light exit surface 22 has a plurality of recesses 23 that bulge towards the light incidence surface 21. Note that the light exit surface with the recesses 23 are denoted as the light emitting side 24, where appropriate, hereafter.

[Shape of the Recesses 23]

Figure 3:
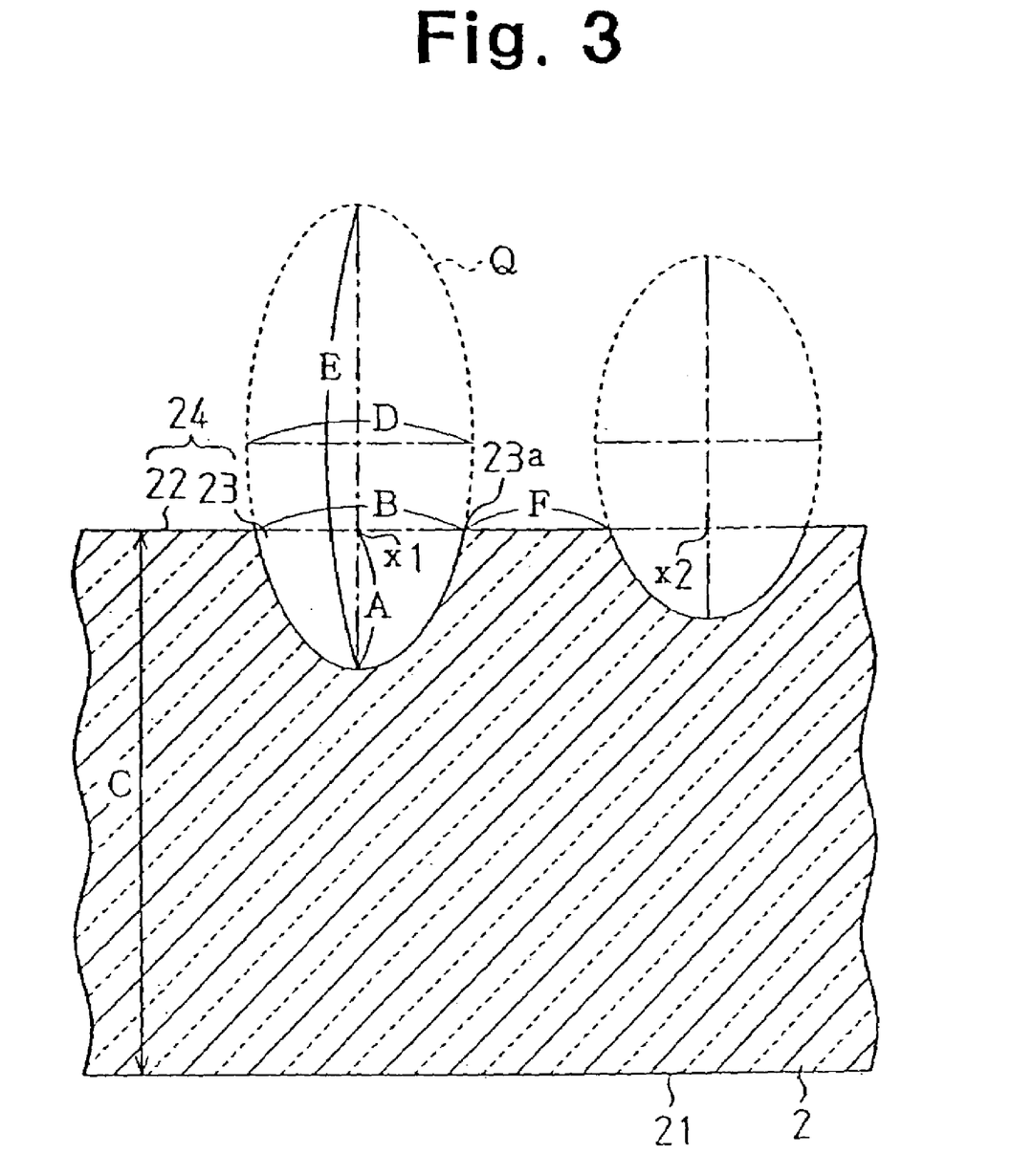
FIG. 3 is an enlarged cross sectional view of a part of FIG. 1 to show the cross sectional shape of recesses.

As shown in the cross sectional view of FIG. 3, the shape of the recesses 23 is approximately of the same shape as a portion of an oval sphere Q. In other words, the cross sectional view is approximately the same as a portion of the oval.

Figure 4:
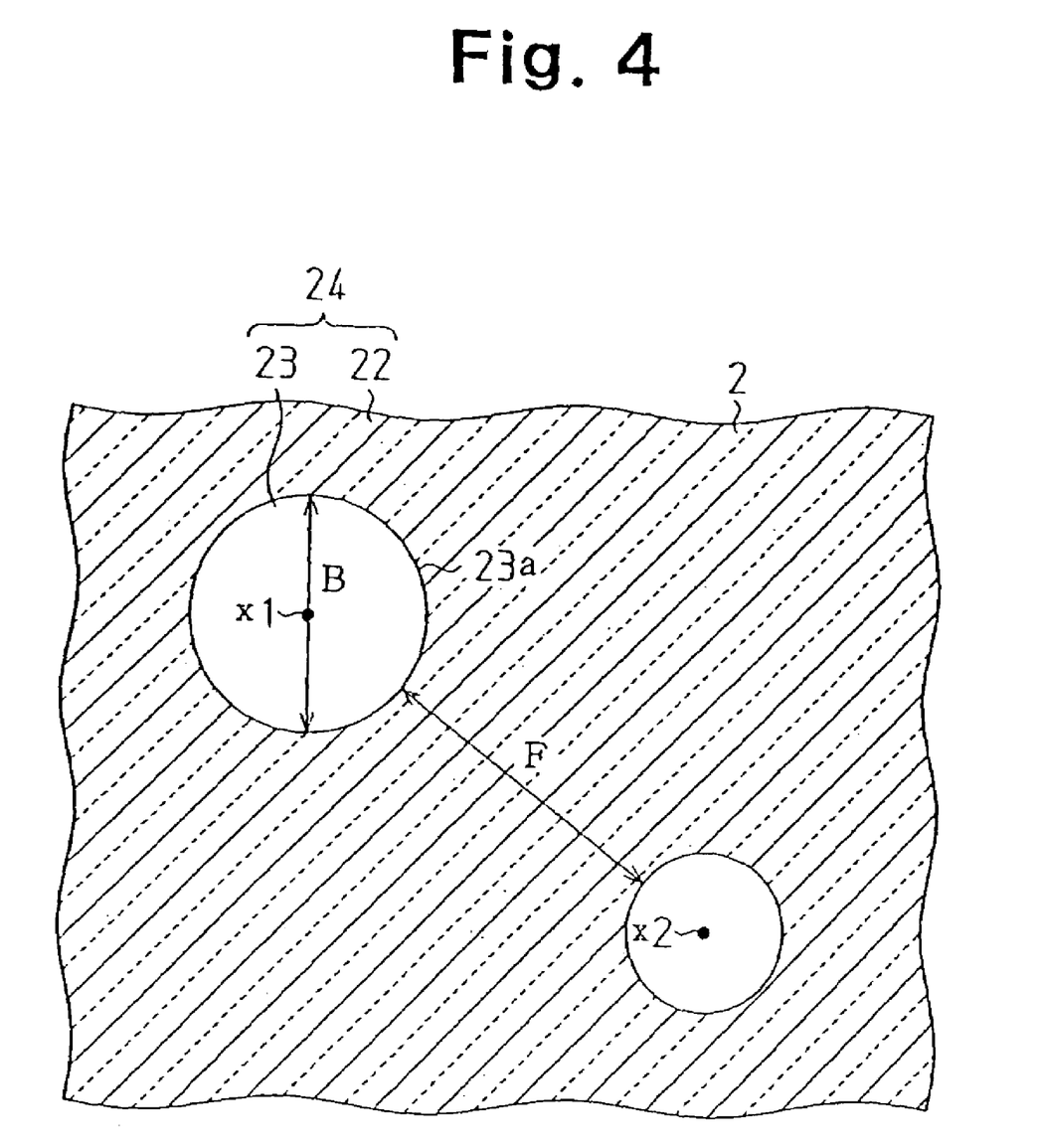
FIG. 4 is a top view enlarging a part of the transparent substrate to show the recess perimeter on the light emitting surface.

Further, as shown in the top view of FIG. 4, the shape of the perimeter 23a of the recess 23 on the light exit surface 22 is generally round.

Note that through the description herein "oval sphere" includes spheres, and "oval" includes circles.

The recess can have a shape approximately of a portion of the oval sphere, in other words the shape of the perimeter on the light exit surface is approximately oval. The shape is not necessarily a curved surface. It is acceptable if there is no plane that is vertical or parallel to the light incidence surface and there are no lines that are vertical or parallel to the light incidence surface. The shape may be of the shape that is similar to a portion of the oval sphere. Note that such a plane or line can be contained as a part of the recess.

By using the shape described above, the amount of light that is emitted from the light emitting side 24 after entering through the light incidence surface 21 is improved that of a transparent substrate whose light emitting side is formed from a plane or a transparent substrate formed with recess or convex portion whose shape is different from those described above. Accordingly, light extraction efficiency is improved.

The luminance in a specific direction in the light emitting side 24 (light exit surface 22) is higher than the transparent substrate formed with recess having a cross sectional shape other than oval. That is, light usage efficiency is higher.

Further, an area which has significantly higher luminance than other areas is unlikely be formed on the light exit surface (an intense emission line is unlikely to happen).

These mechanisms are described below. First described is the mechanism of higher light extraction efficiency obtained by a recess having approximately the same shape as a portion of an oval sphere and having the shape of the perimeter 23a on the light exit surface 22 corresponding approximately to a circle, compared to other transparent substrate having recesses of other shapes.

(Mechanism 1: Mechanism of Contribution of the Shape of the Recess 23 to the Light Extraction Efficiency)

Figure 5A:
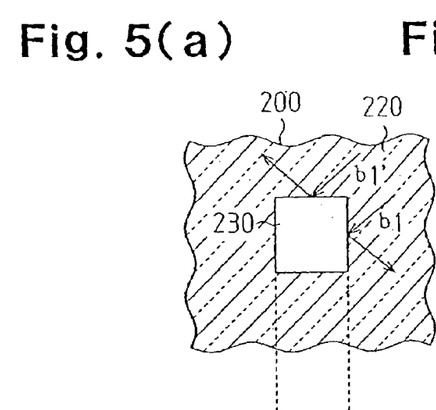
FIGS. 5(a)–5(d) show that the transparent substrate of the invention has higher light extraction efficiency than a transparent substrate having the recesses formed from four planes that are two pairs of parallel planes vertical to the light exit surface, where
Figures 5B, 5D:
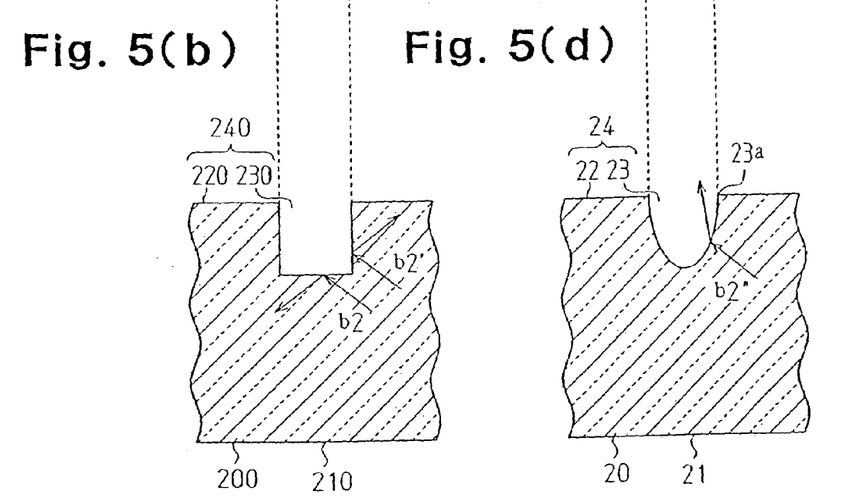

The transparent substrate 200 whose top view is shown in FIG. 5(a) and cross sectional view, in FIG. 5(b), is provided with a recess 230 of rectangular shape. In other words, the recess 230 is formed by four surfaces, two pairs of surfaces that are parallel to each other, and a bottom surface parallel to the light exit surface 220. Accordingly, as shown in FIG. 5(a), light rays are reflected at the recess 230 within the transparent substrate 200 as shown by light ray b1 and light ray b1' (light ray b1 and light ray b1' are parallel to each other). Similarly, as shown by FIG. 5(b), light rays are reflected at the recess 230 within the transparent substrate 200 as shown by light ray b2 and light ray b2' (light ray b2 and light ray b2' are parallel to each other). Therefore, there is light that cannot be emitted to the outside from the light emitting side 240.

Figure 5C:
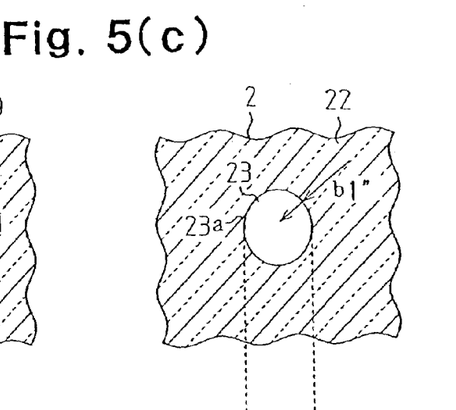

On the other hand, the recess 23 of the transparent substrate 2, shown in the top view of FIG. 5(c) and the cross sectional view of FIG. 5(d), has a portion that is capable of emitting light ray b1" whose propagating direction with respect to the light incidence surface is the same as the light ray b1, and light ray b2" whose propagating direction with respect to the light incidence surface is the same as the light ray b2, towards the outside from the light emitting side 24, due to the shape described above.

Accordingly, the transparent substrate 2 of the embodiment has a higher light extraction efficiency than the transparent substrate 200 having recess formed only from planes that are vertical or parallel to the light exit surface.

Figure 6A:
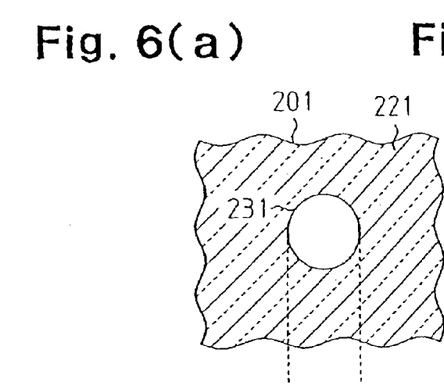
Figures 6B, 6D:
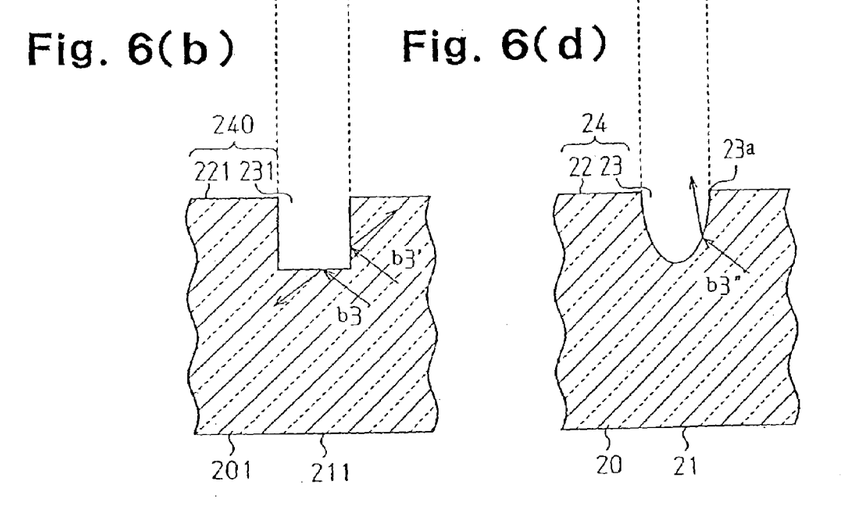

The transparent substrate 201 shown by the top view of FIG. 6(a) and the cross sectional view of FIG. 6(b) is provided with recess 231. The recess 231 is formed from lines that are vertical or parallel to the light exit surface 221 in the cross section of FIG. 6(b). Therefore the recess 231, similar to the rectangular shaped recess 230 of FIGS. 5(a) and 5(b), reflects light with a certain angle (for example light b3) in the direction of thickness of the transparent substrate 201 shown in FIG. 6(b) within the transparent substrate 201.

Figure 6C:
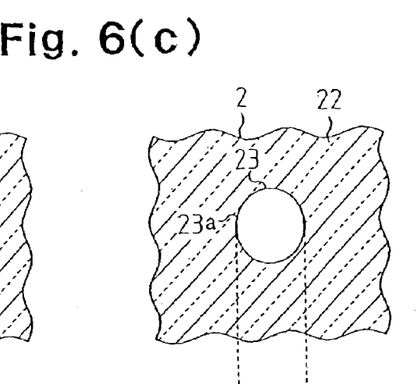

On the other hand, the transparent substrate 2 shown by the top view of FIG. 6(c) and the cross sectional view of FIG. 6(d) has a portion that is capable of emitting light from the light ray b3" emitting side 24, whose propagating direction is identical to the light ray b3 with respect to the light incidence surface.

Accordingly, the transparent substrate 2 of the embodiment has higher light extraction efficiency compared to the transparent substrate 201 provided with the recess having a cross sectional shape formed only from vertical or parallel lines to the light exit surface.

Moreover, the transparent substrate 2 of the embodiment has a higher probability of emitting the light reflected by the recess to the outside by way of the light emitting side 24, compared to the transparent substrate provided with the recess having a cross section formed by parallel or vertical lines to the light exit surface, as shown in FIGS. 5(a), 5(b), 6(a) and 6(b). In other words, light extraction efficiency is high.

Figure 7A:
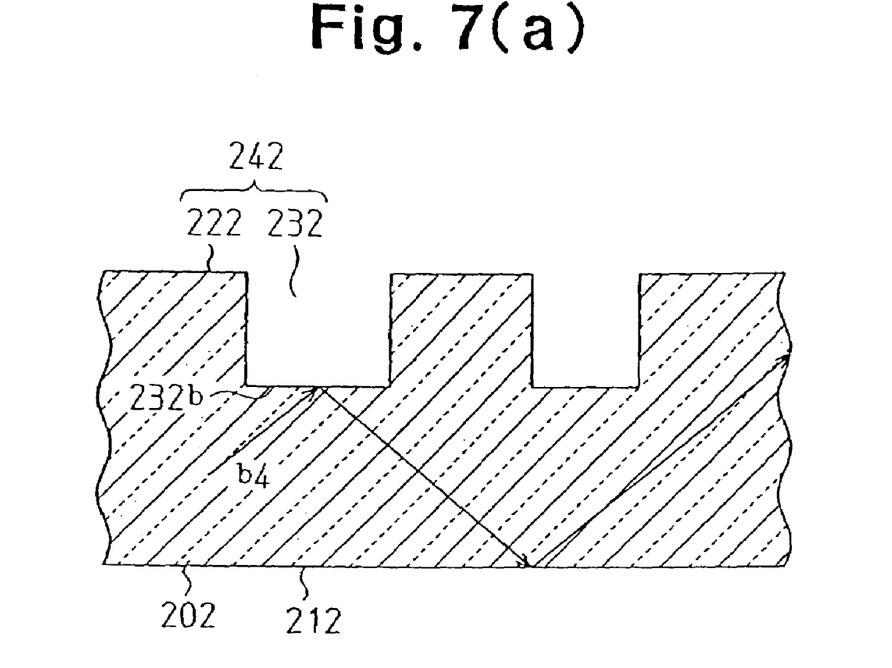
FIGS. 7(a) and 7(b) are cross sectional views which show that the transparent substrate according to one embodiment of the invention has a higher light extraction efficiency than the transparent substrate having recesses, whose cross sectional shape is formed from vertical lines and parallel lines with respect to the light exit surface.

As shown in FIG. 7(a), a light ray b4 reflected on a side 232b of the recess 232 having across-section formed from vertical and parallel lines to the light exit surface has a reflection angle equal to the incident angle. Accordingly, when the light ray is incident on the recess 232 or the light exit surface 222 again, the incident angle is larger than the critical angle and therefore cannot pass to the outside by way of the light emitting side 242.

Figure 7B:
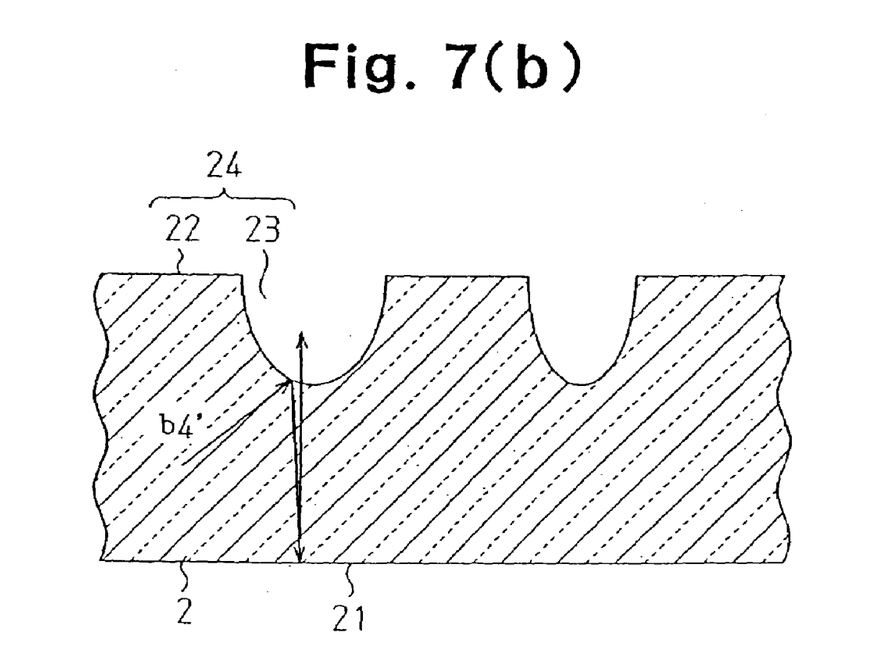

On the other hand, the recess 23 of the embodiment does not have a linear portion and therefore most of the portion of the of the recess alters the angle of reflection from the angle of incidence. In other words, as shown in FIG. 7(b), light ray b4' having the same angle as the light ray b4 with respect to the light incidence surface, is reflected towards the light incidence surface 21 side at the recess 23, reflected by the interface between the transparent substrate 2 and the organic electroluminescence element 3 or the reflecting member 4 and is emitted to the outside by way of the light emitting surface 24.

As described above, the transparent substrate 2 of the embodiment has higher light extraction efficiency, not only than the transparent substrates devoid of any recess or convex portion on the light exit surface, but also higher than the transparent substrates having recesses whose shape are different from the shape of the embodiment.

Figure 8A:
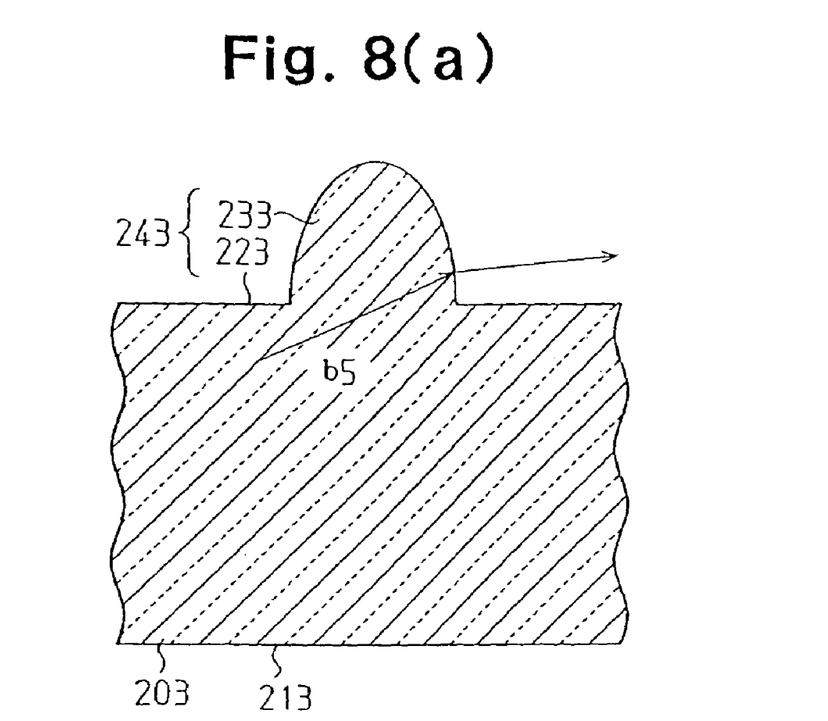
FIGS. 8(a) and 8(b) are cross sectional views which show that the transparent substrate formed with recesses has higher light usage efficiency than the transparent substrate formed with a convex portion.
Figure 8B:
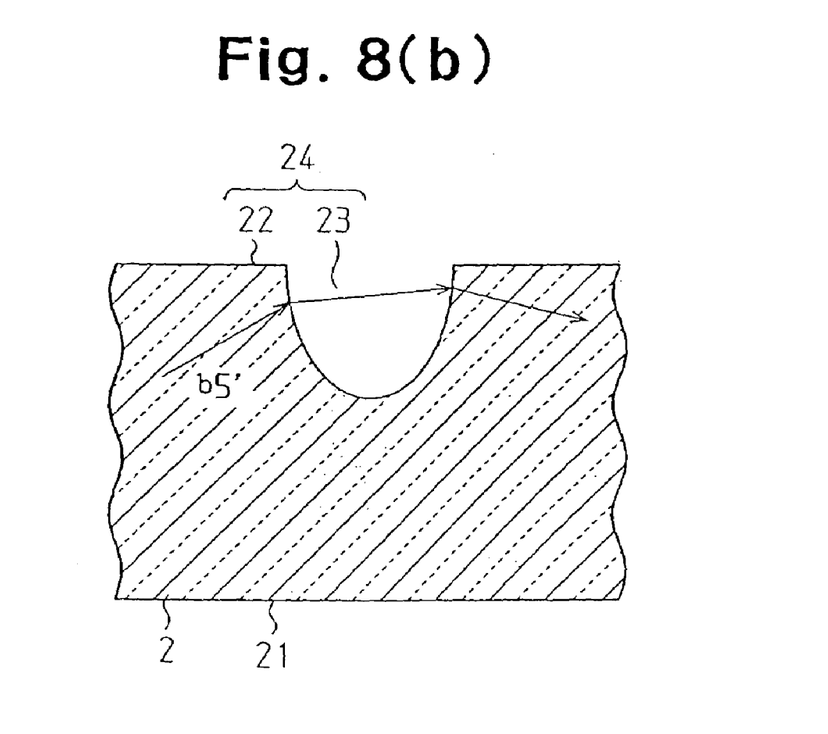

The mechanism of higher light usage efficiency in the transparent substrate 2 of the embodiment compared to transparent substrates formed with convex portions, is described by referring to FIGS. 8(a) and 8(b). Note in FIGS. 8(a) and 8(b) that the light extracted in the normal line direction of the light exit surface is referred to as "usable light."

(Mechanism 2: Mechanism of Improved Light Usage Efficiency Due to Recess)

Light ray b5 enters into convex portion 233 bulging outward on the light exit surface 223 to the side opposite to the light incidence surface 213, shown in FIG. 8(a), is emitted to the outside by way of the light emitting side 243 at the convex portion 233. However, light emitted to the outside cannot be used unless it has normal line component to the light exit surface 223.

On the other hand, the transparent substrate 2 of the embodiment shown in FIG. 8(b) can cause the light to repeatedly propagate into the transparent substrate 2 even when the initial light ray b5' is emitted to the outside by way of the light emitting side 24 at an angle that is not usable. A part of the light which repeatedly propagates is emitted to the outside with a normal line component of the light exit surface 22 through refraction and reflection at the recesses 23.

As described above, the transparent substrate 2 of the embodiment has a recess instead of the convex portion so that the light usage efficiency is improved compared to the substrate having only convex portions and substrates having both convex portions and recesses.

Further, because the recess 23 has a shape approximately identical to a portion of an oval sphere, it is also possible to condense incident light on the recess 23 to a single direction. Accordingly, the light usage efficiency can be extremely improved by appropriately setting the shape of the oval sphere Q and the depth of the recess 23 of FIG. 3.

(Mechanism 3: Mechanism for Suppressing Intense Emission Line)

Figure 9A:
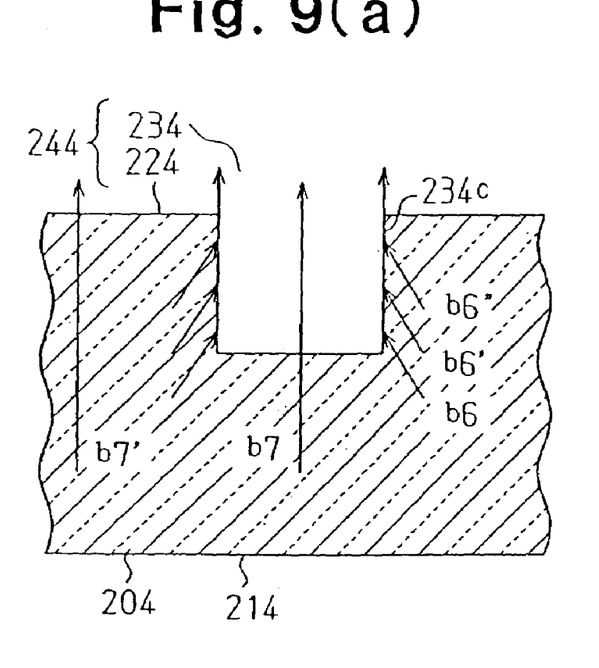
FIGS. 9(a) and 9(b) are cross sectional views which show that the transparent substrate according to one embodiment of the invention has higher uniformity in luminance than the transparent substrate having recesses including polygonal shaped cross section.

As shown in the cross sectional view of FIG. 9(a), groove 234 having straight line portion 234c vertical to the light exit surface 224 in the cross section emits light rays b6, b6', (light rays b6, b6', . . . are parallel to each other), that are incident on the straight line portion 234c at a certain incident angle, along the direction of the straight line portion 234c. On the other hand, in other parts of the light emitting side 244, the light rays b7, b7', . . . , incident in the vertical direction with respect to the light exit surface 224 are emitted in the normal line direction of the light exit surface 224. Therefore, the light emitting side 244 has a much higher amount of light emitted in the normal line direction of the light exit surface 224 at the straight line portion 234c to thereby show an intense emission line.

Figure 9B:
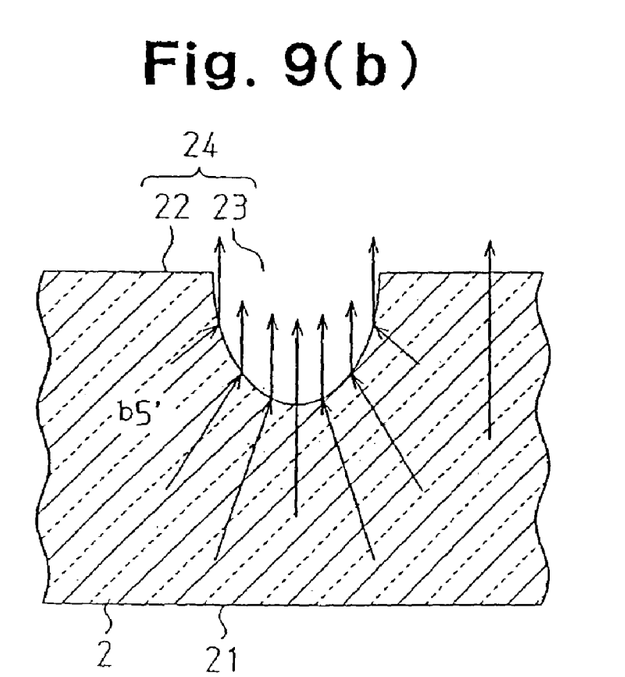

On the other hand, the transparent substrate 2 of the embodiment shown in FIG. 9(b) does not have a long straight line portion like straight line portion 234c of the groove 234 in FIG. 9(a), and it does not cause a significantly high luminance in a specific direction in a specific area of the light emitting side 24.

Further, the inventors have devised to set the depth A of the recess 23 to a length 1.5 folds of diameter B of the perimeter on the light exit surface 22 or less, and to half of the thickness C of the substrate or less, as shown in FIGS. 3 and 4.

The transparent substrate 2 can be broken during production when the depth A of the recess 23 is set at least 1.5 folds of diameter B of the perimeter on the light exit surface 22 or when the depth A is larger than half of the thickness C of the substrate. By forming the recesses in the shape described above and setting the depth as described above, not only excellent light extraction efficiency and light usage efficiency are obtained, but also a robust transparent substrate can be obtained.

This advantage can further be obtained with recesses 23 having depth A of at least 0.1 μm.

Note that the shape and the size of each recess 23 can be identical, or can be different.

[Arrangement of Recess 23]

The inventors have devised that the transparent substrate 2 has higher light extraction efficiency when formed with respectively independent recesses 23 that are not coupled to any other recesses. In particular, the advantages described below can be obtained when the shortest distance F between adjacent recesses 23 is set to at least 50 μm and the distance between centers X of adjacent recess perimeters on the light exit surface 22 is set to at most 200 μm:

When the shortest distance F is set to at least 50 μm, a mask can be readily provided in positions where recesses 23 are not provided on the light exit surface 22, in the case where sandblasting is adopted for forming the recesses 23. Accordingly, the positions and shapes of the recesses 23 can be readily controlled with high accuracy on the light exit surface 22.

When the center distance X is set to at most 200 μm, the recesses 23 is not hardly visible at a height of at least 10 cm above the light exit surface 22 of the transparent substrate 2. Accordingly, it is not very probable that operators will see the recesses 23 when the transparent substrate 2 is used in an area light emitting device for mobile terminals.

Light extraction efficiency is extremely high as is evident from the simulation results shown below.

Simulation Condition 1
Simulation Method: light ray tracing method
Minor Axis D in FIG. 3: 200 μm
Major Axis E in FIG. 3 562 μm
Depth A in FIG. 3: 95 μm (The diameter B of the perimeter on the light exit surface 22 is 150 μm.)

Shortest Distance F between Recesses in FIG. 3:
  varied by 5 μm within 5 μm–300 μm
Position of Luminance Measurement: Luminance in the direction of 50 degrees with respect to normal line of the light exit surface 23
Standard Value: Luminance in the direction of 50 degrees with respect to the light exit surface in a transparent substrate devoid of recesses (Standard 1)

Simulation Condition 2 (Difference from Condition 1)
Depth A in FIG. 3: 40 μm (The diameter B of the perimeter on the light exit surface 22 is 60 μm.)

As the result of the simulations based on the conditions above, luminance of over 1.3 folds the standard value were obtained in either cases.

Further, it was found that luminance of over 1.5 folds the standard value can be obtained in similar simulations when the sum of the diameter B and the shortest distance F is at least the length of minor axis D of the oval sphere and at most the length of major axis E.

Figure 10:
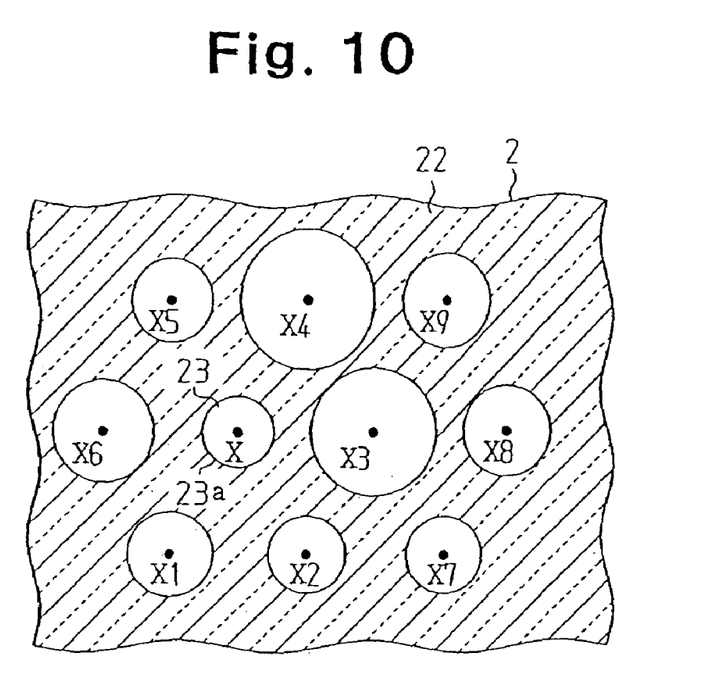
FIG. 10 is a top view showing the arrangement of the recesses on the light exit surface in a hexagonal close-packed structure.
Figure 11:
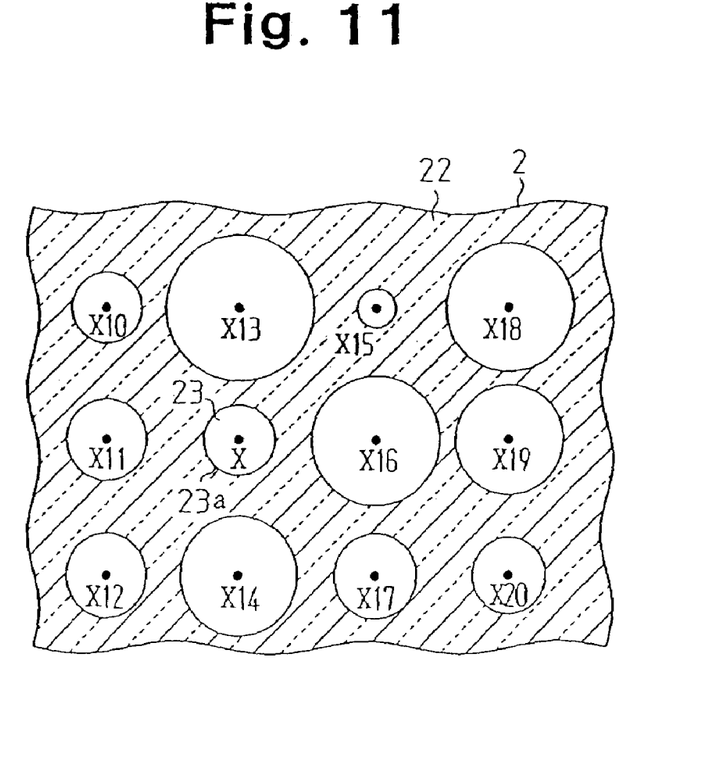
FIG. 11 is a top view showing the arrangement of the recesses on the light exit surface in a cubic close-packed structure.

When the recesses 23 are arranged in an approximately hexagonal close-packed structure with respect to the center X of the perimeter 23a as shown in FIG. 10 or arranged in an approximately in cubic close-packed structure with respect to the center X as shown in FIG. 11, the number of the recesses 23 formed is increased compared to the case where the recesses 23 are disposed on the light exit surface 22 in any other way. Accordingly, the advantages of the embodiment can be enhanced, when these recesses are arranged in this way.

In this case, it is preferable that the distance between center X and centers X1, . . . , X6 in FIG. 10 or the distance between the center X and centers X11, X13, X14, X16 be at most 200 μm and that the shortest distance between the recesses 23 be at least 50 μm.

[Material for Transparent Substrate 2]

Any transparent material can be used for the transparent substrate 2 if it can support the light emitting element such as an organic electroluminescence device 3. Note that the term "transparent" in the specification denotes that there is transmitting performance in the light extracted from the light exit surface 22 to the outside. The light extracted from the light exit surface 22 is approximately set to be in a range of the visible light spectrum (light having wave lengths approximately between 380 nm and 800 nm).

As for such members, any known material that can be used for a transparent substrate for an area light emitting device are used. Generally, ceramic substrates such as glass substrates or quartz substrate, or transparent resin substrates formed from, for example, acrylic, are selected. A composite sheet combining a plurality of identical or difference kinds of substrates can also be used.

[Production Method]

While the recesses 23 can be formed by any known method used for forming recesses on the transparent substrate, such as mechanically cutting or chemical etching, they are preferably formed by sandblasting. The recesses can be formed only by striking the positions with sand where the recesses 23 are provided, when sandblasting is used, and a plurality of recesses 23 can be formed on the light exit surface 22 without providing special protection to the organic electroluminescence device 3 even after the organic electroluminescence device 3 is formed on the light incidence surface 21.

Figure 12:
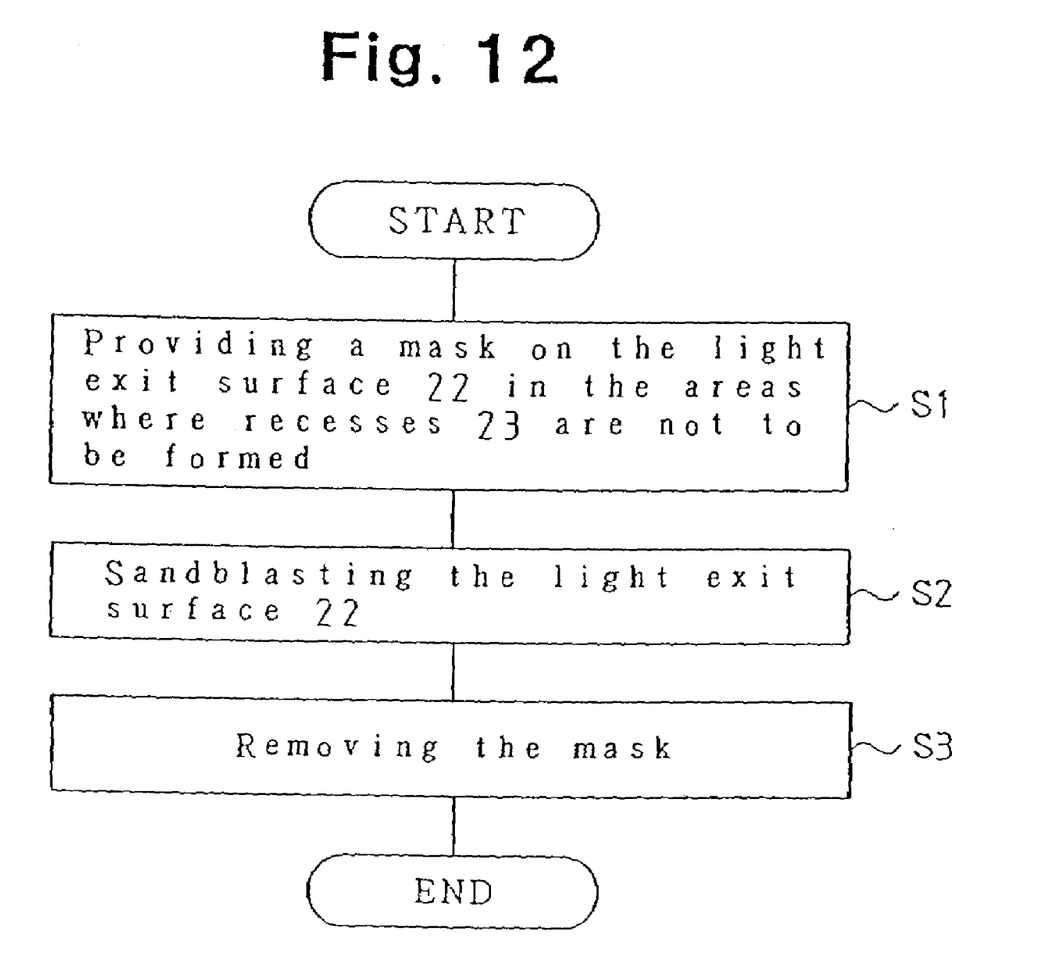
FIG. 12 is a sequence chart showing the steps of a preferred production method for forming recesses on the transparent substrate.

A preferred method for forming the recesses 23 on the light exit surface 22 of the transparent substrate 2 by way of sandblasting is described below while referring to FIG. 12.

Step 1: A mask is formed on positions where the recesses 23 are not to be formed on the light exit surface 22.

Step 2: A sandblasting process is performed on the light exit surface 22 of the transparent substrate 2.

Step 3: The mask is removed.

A plurality of recesses 23 are formed on the light exit surface 22 through the above steps. Further, the process can be performed either before the organic electroluminescence device 3 is formed on the light incidence surface 21, or after formation of the device.

Other elements are described below.

(Organic Electroluminescence Device 3)

An organic electroluminescence device 3 comprises an organic layer mainly formed from organic material containing organic luminescent material such as Alq3, between a pair of electrodes. The organic luminescent material is excited when an electric current flows between the electrodes to recombine with holes and electrodes in the organic layer, and the device emits light when the excited state of the material relaxes to the ground state. The device can be formed through known thin film deposition methods on the light exit surface 21 of the transparent substrate by using materials adopted for use in known organic electroluminescence devices.

Note that the organic electroluminescence device can be altered to any other known light emitting element such as inorganic electroluminescence device or a side-edge type illumination device.

(Light Reflecting Member 4)

The light reflecting member 4 is disposed on a side opposite to the transparent substrate 2 with respect to the organic electroluminescence device 3, and reflects the incident light back towards the organic electroluminescence device 3. The member generally comprises a material selected from metal, metal alloy or metal compounds. The member is formed on the organic electroluminescence device 3 by vapor deposition or is formed by fixing a plate formed from these materials onto the organic electroluminescence device 3.

Figure 13:
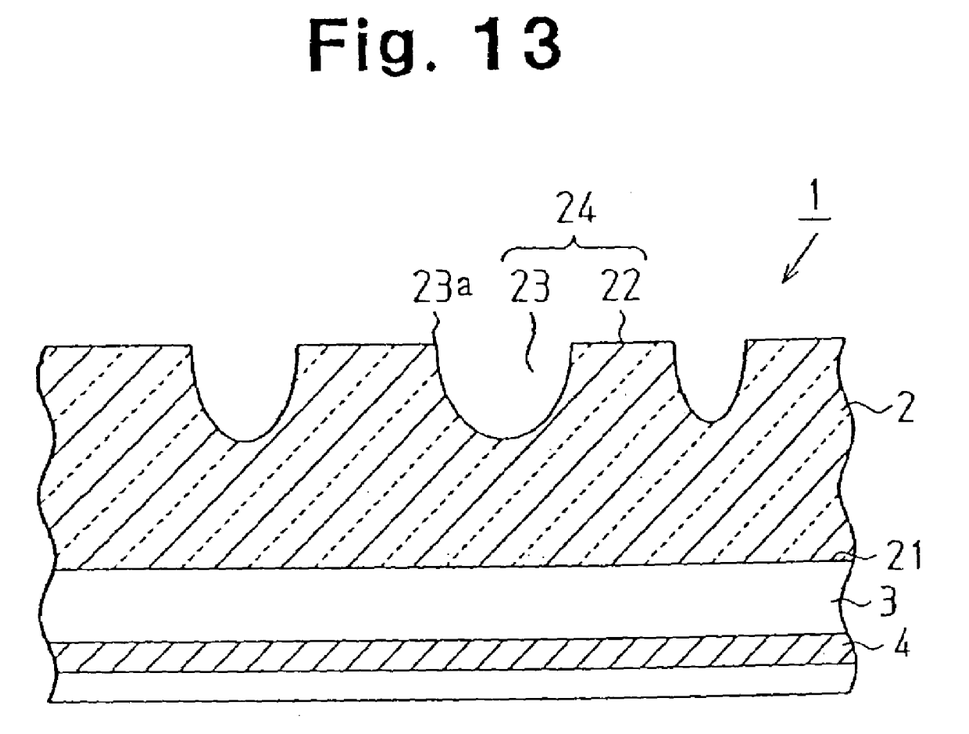
FIG. 13 is a cross sectional view of an area light emitting device showing a light reflecting member provided within the area light emitting device.

Note that the light reflecting member 4 can be disposed within the organic electroluminescence device 3 as shown in FIG. 13. In this case, an electrode is formed on the light emitting layer to be opposite to the transparent substrate 2, from the materials described above to provide the function of the light reflecting member 4.

(Prism Sheet 5)

Figure 14A:
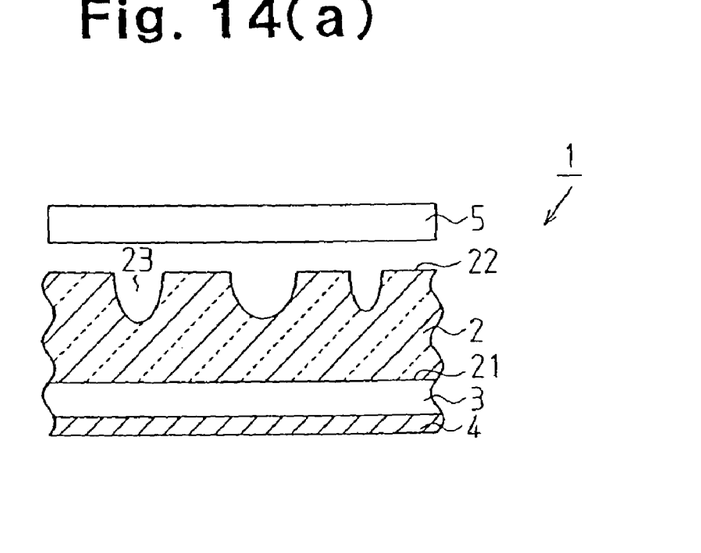
FIG. 14(a) is a cross sectional view of the area light emitting device having a prism sheet.

A prism sheet 5 may be provided on the light exit surface 22 of the transparent substrate 2 in the area light emitting device 1 of one embodiment as shown in FIG. 14(a).

Generally, luminance is improved in random directions on the light exit surface 22 formed with the recesses 23. Light usage efficiency can be improved when the light emitted towards these directions are redirected to a preferred direction by refraction or total reflection of the prism sheet 5.

Known prism sheets, such as refraction type prism sheet and total reflection type prism sheet can be used as the prism sheet 5.

Figure 14B:
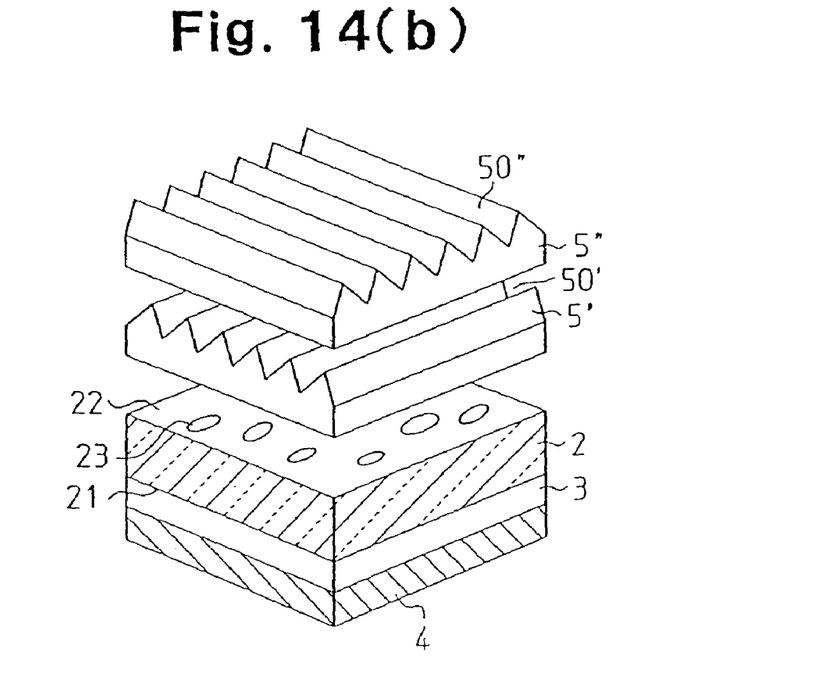
FIG. 14(b) is an exploded perspective view showing the constitution of the area light emitting device having a prism sheet.

A pair of prism sheets are disposed in FIG. 14(b). A plurality of prisms (grooves) 50', 50" extended from one edge surface to the other edge surface in the prism sheets of this type as is known in the art. Among the light rays emitted from the transparent substrate 2, light traveling in four directions can be condensed to a direction along the normal lines of the light exit surface 22 when the two prism sheets are disposed to arrange the direction of the groove 50' in the prism sheet 5' to be approximately perpendicular to that of the groove 50" of the sheet 5".

The liquid crystal display device 6 according to one embodiment is described below.

(Liquid Crystal Display Device 6)

Figure 15:
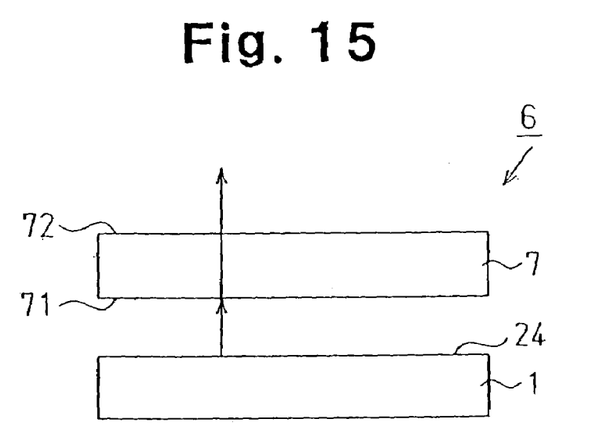
FIG. 15 is a cross sectional view showing the constitution of the liquid crystal display device according to one embodiment of the invention.

FIG. 15 is a cross sectional view illustrating the structure of a liquid crystal display device 6 according to one embodiment.

Figure 16:
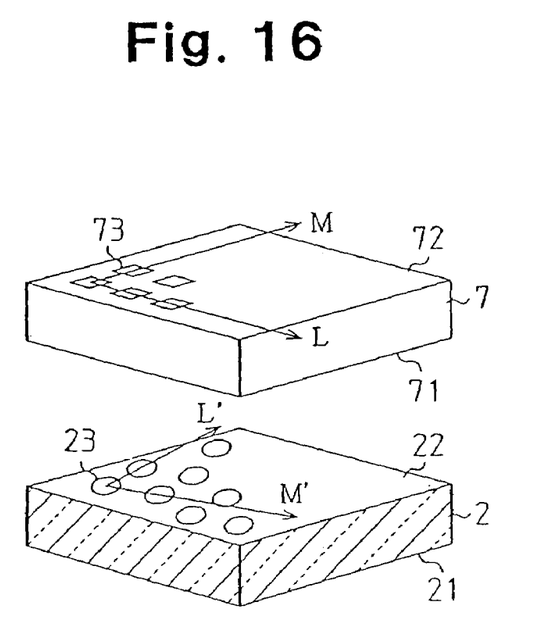
FIG. 16 is an exploded perspective view showing the positional relationship of the liquid crystal display panel and the organic electroluminescence device for preventing moiré.

FIG. 16 is a perspective view showing the positional relationship of the liquid crystal display panel 7 and the area light emitting device 1 for preventing moiré.

As shown in FIG. 15, the liquid crystal display device 6 is provided with the liquid crystal display device panel 7 to face the light extracting side 24 of the area light emitting device 1 (on a side of the transparent substrate 2 opposite to the organic electroluminescence device 3). In other words, the liquid crystal display device panel 7 is disposed in the path of the light emitted from the area light emitting device 1.

The liquid crystal display panel 7 is disposed so that its non-displaying surface 71 and the area light emitting device 1 oppose each other. The amount and the conditions of light which enters from the non-displaying surface 71 and is emitted from the light exit surface 72 is adjusted by each pixel to display patterns (images) on the light exit surface 72. There are transmissive type panels and semi-transmissive type panels among the panels. In order to prevent moiré due to the recesses 23 disposed on the light exit surface 22 of the transparent substrate 2 and the pixels 73 on the liquid crystal display device panel 7, the straight lines M and L which are formed by centers of the adjacent pixels 73, and the straight lines M' and L' which are formed by centers X of the perimeters 23a of the adjacent recesses 23 are placed so that they are displaced to each other when viewed from the display surface 72 of the liquid crystal display device panel 7.

It should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope and equivalence of the appended claims.

What is claimed is:

1. An area light emitting device comprising:
    a transparent substrate comprising:
        a light incidence surface;
        a light exit surface opposite to the light incidence surface; and
        a plurality of recesses formed on the light exit surface bulging towards the light incidence surface,
        wherein the surfaces of each recess form a shape approximately corresponding to a portion of an oval sphere,
        wherein the perimeter of each recess on the light exit surface is approximately circular, and
        wherein each recess is separately formed from the other recesses; and
    an area light emitting element disposed on the opposite side of the light exit surface of the transparent substrate,
    wherein a light reflecting member is disposed on the area light emitting element opposite to the transparent substrate or within the area light emitting device to reflect light incident from the transparent substrate back towards the transparent substrate, and
    wherein the light emitted from the area light emitting device exits by passing through the transparent substrate.

2. The area light emitting device according to claim 1, wherein the shortest distance between a recess and its nearest adjacent recess is at least 50 μm, and the distance between centers of areas defined by recess perimeters on the light exit surface is at most 200 μm.

3. The area light emitting device according to claim 1, wherein each recess is positioned so that the sum of a diameter of an area defined by a recess perimeter on the light exit surface and the shortest distance between the perimeter of a first recess and the perimeter of a nearest recess is at least the length of a minor axis of the oval sphere and is at most the length of a major axis of the oval sphere.

4. The area light emitting device according to claim 1, wherein the recesses are arranged to be approximately hexagonally close-packed or cubic close-packed with respect to the centers of the recess perimeters on the light exit surface.

5. The area light emitting device according to claim 1, wherein each recess has a depth which is at most a half the thickness of the transparent substrate and is at most 1.5 times the diameter of the perimeter on the light exit surface.

6. The area light emitting device according to claim 1, wherein the area light emitting element is an organic electroluminescent element or an inorganic electroluminescent element.

7. The area light emitting device according to claim 1, wherein a prism sheet is disposed opposite to the light emitting element on the transparent substrate.

8. A liquid crystal display device comprising an area light emitting device according to claim 1, and a liquid crystal display panel disposed in the path of the light emitted from the area light emitting device.

9. The liquid crystal display device according to claim 8, wherein the liquid crystal display panel is positioned relative to the area light emitting device so that straight lines formed between centers of adjacent pixels on the liquid crystal display panel and straight lines formed between centers of adjacent recess perimeters on the light exit surfaces are displaced from each other when viewed from a display surface of the liquid crystal display panel.

10. A method for forming an area light emitting device, said area light emitting device including a transparent substrate which includes a light incidence surface and a light exit surface opposite to the light incidence surface, the method comprising:
    sandblasting at least one area of the light exit surface of the transparent substrate to form a plurality of recesses in said at least one area, with the recesses bulged towards the light incidence surfaces, wherein each recess includes a surface formed in a shape approximately corresponding to a portion of an oval sphere, with each recess having a perimeter on the light exit surface that is approximately circular, and each recess being separately formed from the other recesses;
    forming an area light emitting element on the transparent substrate on the opposite side of the light exit surface; and
    disposing a light reflecting member on the area light emitting element opposite to the transparent substrate or within the area light emitting device to reflect light incident from the transparent substrate back towards the transparent substrate, so that the light emitted from the area light emitting device exits by passing through the transparent substrate.

11. The method for forming a transparent substrate according to claim 10, wherein before said sandblasting, a mask is provided on the light exit surface of the transparent substrate, in areas where recesses are not to be formed.

* * * * *